(12) United States Patent
Graesslin et al.

(10) Patent No.: US 9,316,710 B2
(45) Date of Patent: Apr. 19, 2016

(54) SAR HOTSPOT REDUCTION BY TEMPORAL AVERAGING IN PARALLEL TRANSMISSION MRI

(75) Inventors: Ingmar Graesslin, Hamburg (DE); Ferdinand Schweser, Hamburg (DE); Peter Boernert, Hamburg (DE); Paul Royston Harvey, Eindhoven (NL)

(73) Assignee: Koninklijke Philips N.V., Eindhoven (NL)

( * ) Notice: Subject to any disclaimer, the term of this patent is extended or adjusted under 35 U.S.C. 154(b) by 938 days.

(21) Appl. No.: 13/258,622

(22) PCT Filed: Mar. 31, 2010

(86) PCT No.: PCT/IB2010/051399
§ 371 (c)(1),
(2), (4) Date: Sep. 22, 2011

(87) PCT Pub. No.: WO2010/113122
PCT Pub. Date: Oct. 7, 2010

(65) Prior Publication Data
US 2012/0013337 A1    Jan. 19, 2012

(30) Foreign Application Priority Data

Apr. 1, 2009 (EP) .................................... 09157061

(51) Int. Cl.
*G01R 33/44* (2006.01)
*G01R 33/3415* (2006.01)
*G01R 33/561* (2006.01)
*G01R 33/28* (2006.01)
(Continued)

(52) U.S. Cl.
CPC ........ *G01R 33/3415* (2013.01); *G01R 33/5612* (2013.01); *G01R 33/288* (2013.01); *G01R 33/543* (2013.01); *G01R 33/5659* (2013.01)

(58) Field of Classification Search
CPC ............. G01R 33/288; G01R 33/5612; G01R 33/3415; G01R 33/5659; G01R 33/543; G01R 33/583; G01R 33/54
USPC .................................................. 324/307, 309
See application file for complete search history.

(56) References Cited

U.S. PATENT DOCUMENTS 7,282,914 B2 * 10/2007 Morich et al. ................. 324/318
7,336,145 B1    2/2008 Zelinski et al.
7,385,396 B2    6/2008 Zhu
(Continued)

OTHER PUBLICATIONS

Graesslin, I., et al.; SAR Hotspot Reduction by Temporal Averaging in Parallel Transmission; 2009; Proc. Intl. Soc. Mag. Reson. Med.; 17:176.
(Continued)

*Primary Examiner* — Melissa Koval
*Assistant Examiner* — Rishi Patel

(57) ABSTRACT

A magnetic resonance sequence includes a repetitively applied radiofrequency pulse capable of causing a specific absorption rate (SAR) hot spot. The composition of the repetitive pulse is varied to generate versions of the repetitive pulse such that the SAR hot spot changes locations with subsequent applications of the repetitive pulse. To generate versions of the pulse, a pilot scan is performed to generate a patient model. A simulation of the SAR response to each of the versions of the repetitive pulse is performed to determine the location of SAR hot spot(s). A plurality of versions of the repetitive pulse is selected to be used in the magnetic resonance sequence.

19 Claims, 3 Drawing Sheets

(51) Int. Cl.
  *G01R 33/54* (2006.01)
  *G01R 33/565* (2006.01)

(56) References Cited

U.S. PATENT DOCUMENTS

| | | | |
|---|---|---|---|
| 7,508,205 B2* | 3/2009 | Thelissen et al. | 324/307 |
| 8,890,524 B2* | 11/2014 | Boernert et al. | 324/309 |
| 2005/0110488 A1 | 5/2005 | Zhu | |
| 2010/0134105 A1* | 6/2010 | Zelinski et al. | 324/309 |

OTHER PUBLICATIONS

Graesslin, I., et al.; A Minimum SAR RF Pulse Design Approach for Parallel Tx with Local Hot Spot Suppression and Exact Fidelity Constraint; 2008; Proc. Intl. Soc. Mag. Reson. Med.; 16:621.

Zelinski, A. C., et al.; Pulse Design Methods for Reduction of Specific Absorption Rate in Parallel RF Excitation; 2007; Proc. Intl. Soc. Mag. Reson. Med.; 15:1698.

Zelinski, A. C.; Chapter 9—Reduction of Maximum Local Specific Absorption Rate via Pulse Multiplexing in Zelinski, A. C.: Improvements in Magnetic Resonance Imaging Excitation Pulse Design; 2008; pp. 217-253.

"IEEE Recommended Practice for Measurements and Computation of Radio Frequency Electromagnetic Fields.." IEEE Standard C95.3 Dec. 11, 2002.

International Standard Medical Electrical Equipment 2002, Ref. No. IEC 60601-2-33:2002 (E).

Graesslin et al "SAR Simulations and Experiments for Parallel Transmission" Proc. Intl. Soc. Mag. Reson. Med. 15 (2007) p. 1090.

Grissom et al A Spatial Domain Method for the Design of RF Pulses in Multi-Coil Parallel Excitation , Proc. Intel. Soc. Mag. Reson. Med. 14 (2006).

Katscher et al "Transmit SENSE" Magnetic Resonance in Medicine, 49: p. 144-150 (2003).

Vernickel et al "Eight-Channel Transmit/Receive Body MRI Coil at 3T" Magnetic Resonance in Medicine 58: p. 381-389 (2007).

Zhu "Parallel Excitation with an Array of Transmit Coils" Magnetic Resonance in Medicine 51: p. 775-784 (2004).

Brunner et al "Enforcing Strict Constraints in Multiple Channel RF Pulse Optimization" Proc. Intl. Soc. Mag. Reson. Med. 15 (2007) p. 1690.

Grasslin et al "Whole Body 3T MRI System with Eight Parallel RF Transmission Channels" , Proc. Intl. Soc. Mag. Reson. Med. 14, (2006) p. 129.

Grasslin et al "A Minimum SAR RF Pulse Design Approach for Parallel Tx with Local Hot Spot Suppression and Exact Fidelity Constraint t RF Transmission Channels", Proc. Intl. Soc. Mag. Reson. Med. 16, (2008) p. 621.

* cited by examiner

SAR HOTSPOT REDUCTION BY TEMPORAL AVERAGING IN PARALLEL TRANSMISSION MRI

FIELD OF THE INVENTION

The present application relates to the method of magnetic resonance arts. It finds particular application for imaging patients with multiple transmit coils and is described with particular reference thereto.

BACKGROUND OF THE INVENTION

Radiofrequency (RF) pulses applied during MR imaging causes potential heating of tissue due to the RF power or energy absorbed. The rate at which radiofrequency energy is deposited into the tissue is defined as the specific absorption rate (SAR) and is generally measured in units of watts per kilogram (W/kg). As field strength increases, the RF power deposition and the associated local specific absorption rate (SAR) also increase. For example, doubling the field strength from 1.5 Tesla (T) to 3 T results in a quadrupling of the SAR. Therefore, SAR limits are legally mandated to ensure patient safety. Hot spots, or regions of concentrated energy deposition, occur in tissue with high conductivity such as muscles, the spinal cord and the eyes, or at tissue interfaces with high dielectric constant such as muscle-fat or muscle-bone interfaces.

The SAR becomes a limiting factor for many MR imaging applications because it is dependent on field strength, RF power, flip angle, transmit coil type, and body size. In a multi-shot MR sequence, the same RF pulses are typically repeated numerous times in order to acquire an image. For example, some sequences call for applying the same RF excitation pulse before collection of each line of k-space data. Other RF pulses, such as preparation pulses, RF manipulation pulses, and the like, may also be applied multiple times during a sequence. It is possible to limit the magnitude of hot spots by limiting the amplitude and increasing the duration of the RF pulses; however, in certain imaging sequences the contrast is dependent on the flip angle of the RF excitation pulse and increased duration may yield motion artifacts.

In MR scanners with multiple, independently controlled transmit ($T_x$) elements, each pulse is the combination of the contributions of all of the elements. This provides greater flexibility in designing RF pulses. For example, electrical field information can be incorporated into the RF pulse design to minimize the SAR. Minimal SAR RF pulses can be selected from the large solution space due to the extra degree of freedom in the RF pulse design. For an N-channel $T_x$ system and a small flip angle, the excitation pattern can be written in matrix notation as:

$$m=Ab \quad \text{(equation 1)}$$

where m describes a target excitation pattern, A is a system matrix, and b is a matrix of concatenated RF pulses $b_n$ ($1 \leq n \leq N$) of the individual $T_x$ elements. Provided that the RF field inside the subject responds linearly to the currents driving the field, the SAR can be expressed in a quadratic form in the pulse samples:

$$SAR=b^\dagger Qb \quad \text{(equation 2)}$$

where † denotes the conjugate transpose and Q is a block-diagonal positive definite matrix corresponding to a specific subject volume calculated from a solution of Maxwell's equations. In regimes with large flip angles, the excitation responds non-linearly to the RF field and equation 1 can be adapted for the non-linearity.

A proposed method for local SAR hot-spot reduction (Graesslin I, et al. [2008] ISMRM 16:621) incorporates knowledge about the spatial SAR distribution of an initial RF pulse into Q and a relaxed minimization of the equation $b^\dagger Qb$ such that m=Ab. Using an initial RF pulse that is optimal with respect to global SAR, reduction of a single hot-spot was achieved via:

$$Q=\Sigma_i q_i Q_{region(i)} \quad \text{(equation 3)}$$

where $q_i$ are real weighting factors specifying a trade-off between different hotspot regions. However, in Graesslin I, et al. [2008] ISMRM 16:621, the same RF pulses $b_n$ are repeatedly applied during a multi-shot imaging sequence creating a hotspot in the same place repetitively in which the cumulative effect may be undesirable.

The present application provides a new and improved method and apparatus which overcomes the above-referenced problems and others.

SUMMARY OF THE INVENTION

In accordance with one aspect, a magnetic resonance method includes applying a magnetic resonance sequence which includes a repeating or repetitive $B_1$ pulse capable of causing one or more SAR hot spots. The composition of the repeated $B_1$ pulse is varied such that the SAR hot spots change location with subsequent applications of the repeated $B_1$ pulse.

In accordance with another aspect, a magnetic resonance system includes N number of RF transmitters connected to N number of transmit elements disposed adjacent a patient receiving region. A control processor is programmed to control the transmit elements to apply a plurality of variations of a repeated $B_1$ pulse during a magnetic resonance sequence in which the variations of the repeated $B_1$ pulse cause SAR hot spots at different locations in a patient. A magnetic resonance receiver receives the resonance signal generated by the magnetic resonance sequence. The resonance signal is processed by a resonance signal processor and the images are displayed on a display.

One advantage is that increased duty cycle and flip angle can be achieved to shorten acquisition times and improve image contrast.

Another advantage is that RF pulses can be accelerated.

Another advantage is that higher field strengths can be utilized. Another advantage is that patient safety is improved.

Still further advantages of the present invention will be appreciated by those of ordinary skill in the art upon reading and understand the following detailed description.

BRIEF DESCRIPTION OF THE DRAWINGS

The drawings are only for purposes of illustrating potential embodiments and are not to be construed as limiting.

DETAILED DESCRIPTION OF EMBODIMENTS

Figure 1:
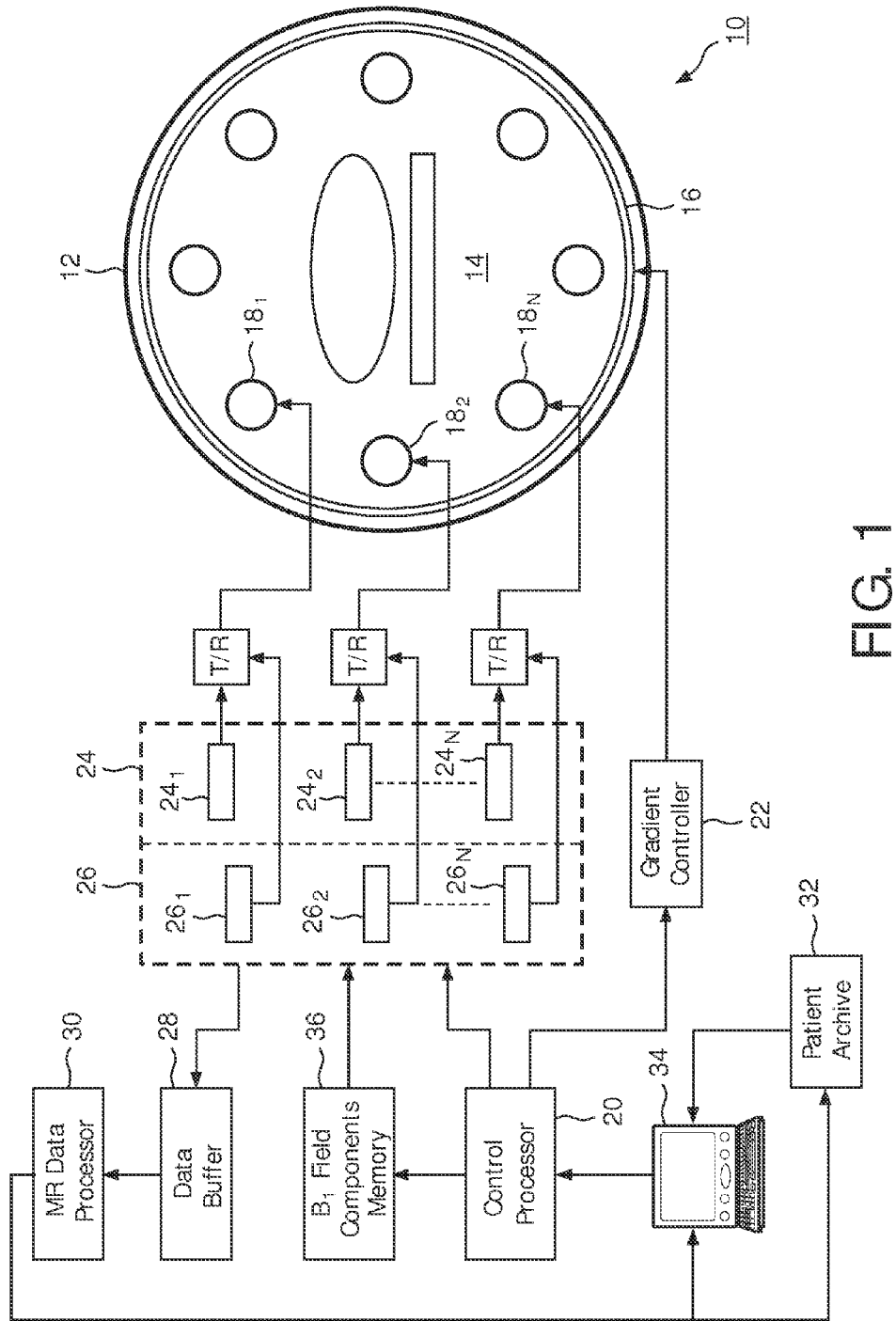
FIG. 1 is a diagrammatic illustration of a magnetic resonance imaging system.

With reference to FIG. 1, a magnetic resonance imaging system 10 includes a main magnet 12 which generates a temporally uniform $B_0$ field through an examination region 14. The main magnet can be an annular or bore-type magnet, a C-shaped open magnet, other designs of open magnets, or the like. Gradient magnetic field coils 16 disposed adjacent the main magnet serve to generate magnetic field gradients along selected axes relative to the $B_0$ magnetic field. A radio frequency coil or coil array 18, including a plurality of discrete RF elements $18_1$, $18_2$ ... $18_N$ is disposed adjacent the examination region. In a multi-coil array, each discrete RF element would be an independently operable RF coil.

A scan control processor 20 controls a gradient controller 22 which causes the gradient coils to apply selected magnetic field gradient pulses across the imaging region, as may be appropriate to a selected magnetic resonance imaging or spectroscopy sequence. The scan controller 20 also controls N discrete RF transmitters $24_1$, $24_2$ ... $24_N$ which causes the RF elements $18_1$, $18_2$ ... $18_N$ collectively to generate magnetic resonance excitation and manipulation $B_1$ pulses. Each $B_1$ pulse is a superposition of individual pulses $b_1$, $b_2$ ... $b_N$ (not shown) from the RF elements $18_1$, $18_2$ ... $18_N$, respectively. The scan controller also controls one or more RF receivers 26 (comprising N discrete RF receivers $26_1$, $26_2$ ... $26_N$) which are connected to the RF elements $18_1$, $18_2$ ... $18_N$ via a transmit/receive switch to receive magnetic resonance signals therefrom.

The received data from the receivers 26 is temporarily stored in a data buffer 28 and processed by a magnetic resonance data processor 30. The magnetic resonance data processor can perform various functions as are known in the art, including image reconstruction (MRI), magnetic resonance spectroscopy (MRS), catheter or interventional instrument localization, and the like. Reconstructed magnetic resonance images, spectroscopy readouts, interventional instrument location information, and other processed MR data are stored in memory, such as a medical facility's patient archive 32. A graphic user interface or display device 34 includes a user input device which a clinician can use for controlling the scan controller 20 to select scanning sequences and protocols, display MR data, and the like.

In typical magnetic resonance sequences, the RF excitation and manipulation $B_1$ pulses are repeatedly applied during multi-shot imaging sequences. If the pulses were identical in each repetition, one or more static SAR hot spots could occur in a critical region of the patient. The weighting factor q (equation 3) can be chosen to be optimized and move the local SAR hot spot(s) to a selected, non-critical region of the patient, e.g. the extremities. The reduction of SAR hot spots is dependent on the excitation pattern, reduction factor, patient model/parameters, gradient trajectory, and the patient's position. It should be noted that alternative methods, other than equations 2 and 3, for calculating the SAR are also contemplated.

The SAR is further reduced by exploitation of a temporal degree of freedom of multi-shot imaging sequences. Because each $B_1$ pulse is a combination or sum of the individual pulse components $b_1$, $b_2$ ... $b_N$, the same effective $B_1$ pulse can be created with the individual components weighted differently to create a combination of distinct pulse components. In successive applications, different combinations of components $b_1$, $b_2$ ... $b_N$ are applied together which result in the same desired target excitation pattern or variation or configuration of a $B_1$ pulse. The sequence is partitioned into L regions where different versions of the excitation pulse $b_n^l$ ($1 \leq l \leq L$) are applied. Because different computations of the components go into each variation, the $B_1$ pulse has different spatial distributions of SAR in each variation. When the RF pulse is repeatedly applied in an MR sequence each time with one of the different variations, the total average SAR is leveled out by time averaging. As a consequence, the allowed RF duty cycle or flip angle of a scan can be increased, which allows for faster acquisition and improved contrast for MRI/MRS. This method to reduce SAR exploits the temporal degree of freedom of multi-shot imaging sequences. The successive application of RF pulse components yields altogether the desired target excitation pattern, with each RF pulse variation inducing a different spatial distribution of SAR, thereby leveling out the global SAR by time-averaging. This method for local SAR reduction is important for SAR limited scans, e.g. Transmit SENSE with high reduction factors, at higher field strengths, zoom imaging, arterial spin labeling, or local excitation.

When a patient is placed inside the scanner or repositioned, a calibration scan is conducted to calibrate the $B_1$ components $b_1$, $b_2$ ... $b_N$. The calibration scan is used to generate $B_1$ maps from which the individual pulse components $b_1$, $b_2$ ... $b_N$ can be calculated. A plurality of combinations of the $B_1$ components $b_1$, $b_2$ ... $b_N$ are calculated which result in each $B_1$ pulse that will be repeatedly applied in a selected sequence, but with its SAR hot spot(s) in different non-critical locations in the patient and minimized. These combinations of $B_1$ components are stored in a $B_1$ field component memory 36 to be accessed serially, randomly, or the like during the selected imaging sequence.

Figure 2:
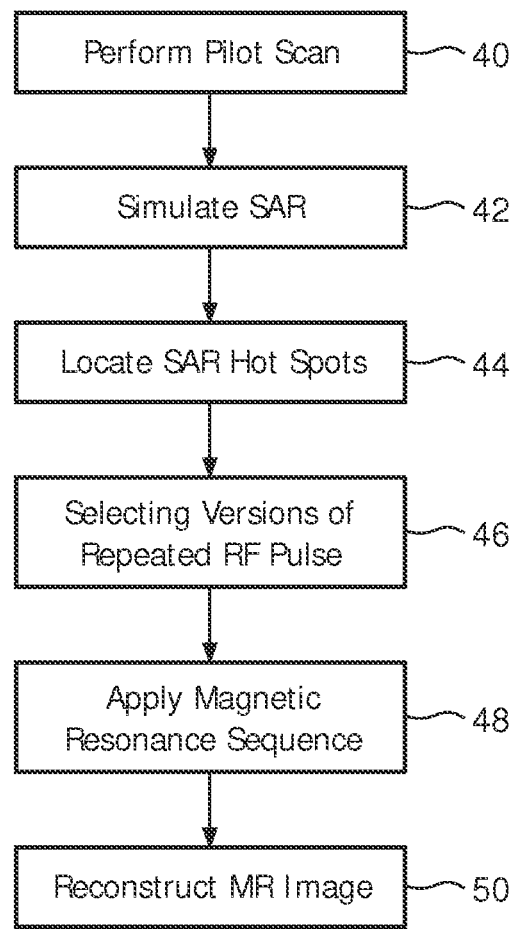
FIG. 2 is a flow diagram of the process of generating versions of a repeated RF pulse as part of a magnetic resonance sequence.

With reference to FIG. 2, a magnetic resonance sequence is composed of one or more repetitively applied $B_1$ pulse(s). Before applying the sequence, an energy distribution check is performed to see if the $B_1$ pulse generates a SAR hot spot in one or more areas that are highly sensitive or susceptible to the absorbed RF energy, e.g. eyes, spine, and various organs in the trunk of the patient. The $B_1$ pulse is varied in composition so as to vary the location of SAR hot spots. A plurality of versions of the repeated $B_1$ pulse are generated and stored in the memory 36 such that the SAR is minimized and the hot spots are in a plurality of locations. The versions are generated by first performing a pilot scan 40 to generate a patient model. The pilot scan can be a low resolution MR scan, a moving bed imaging scan, or a multi-station scan. The patient model includes patient related information such as physical attributes, patient position relative to transmit elements, electromagnetic field within the patient volume, and the like. The patient model is used to simulate the SAR 42 and locate local SAR hot spots 44. Alternatively, the pilot scan is used for model selection from a data base of pre-calculated models. A simulation of the electromagnetic field can be lengthy; therefore, pre-calculated models representing a closest match to the patient can be selected from a database based on the pilot scan, patient information, or the like. If the pre-calculated model deviates too much from the patient, then an extra margin of safety is introduced, e.g. simulating the electromagnetic field within the patient. Optionally, the patient model can be partitioned into a plurality of regions and the SAR simulated in each region. The simulated regions are assigned various weights and recombined to generate a desired SAR distribution. The desired SAR distribution corresponds to the desired $B_1$ pulse or the target excitation pattern m (equation 1). Different versions of the recurring or repetitive $B_1$ pulse are selected 46 from the large solution space corresponding to m such that the local hot spots are located in different areas of the patient. Optionally, slightly varying target excitation patterns may be employed to further increase the solution space and enable higher SAR reduction performance. The process may be iterated multiple times to generate a sufficient number of RF pulses for the magnetic resonance sequence. The SAR optimal magnetic resonance sequence is applied 48 to the patient so that the MR data can be measured and reconstructed 50 into an image representation of the patient.

Figure 3:
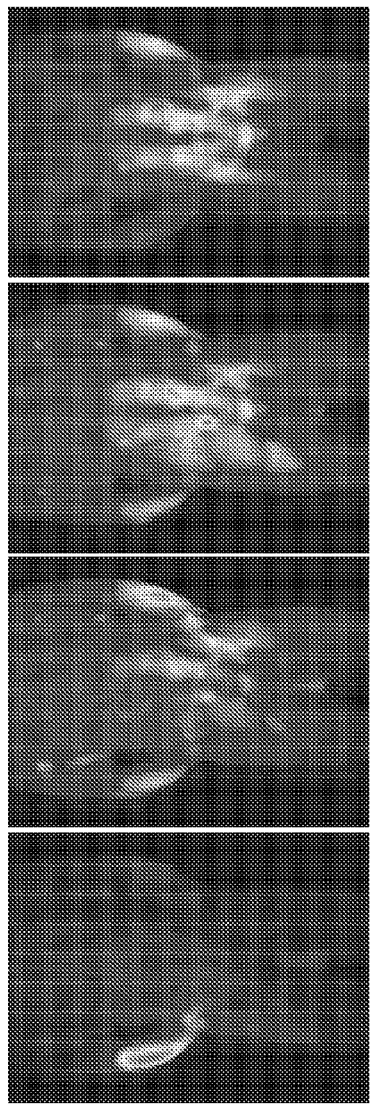
FIG. 3 illustrates individual spatial distributions for different RF pulses in a patient.
Figure 4B:
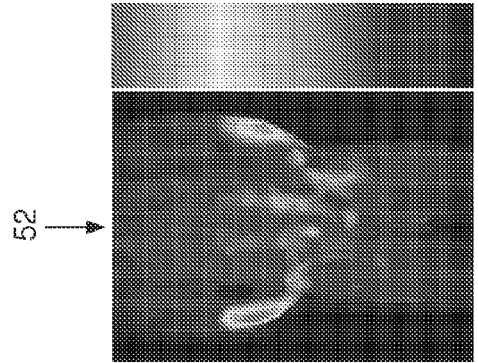
FIGS. 4A and 4B illustrate a SAR distribution from an initial RF pulse (4A) and the results of the local SAR reduction (4B).
Figure 4A:
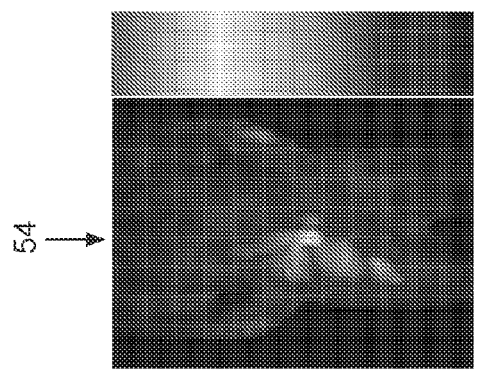

With reference to FIG. 3, individual SAR distributions for different RF pulses are illustrated for comparison in which L=4 different like $B_1$ pulses are used for temporal averaging. With reference to FIGS. 4A and 4B, the initial $B_1$ pulse results in a SAR distribution 54. Optimizing the SAR results in an improved $B_1$ pulse which results in an SAR distribution 52 that limits hot spots in the pelvic region to 68%. In this manner, the SAR is optimized and the location of hot spots is moved to non-critical regions.

In one embodiment, the SAR hot spots are defined and assigned to locations in the patient model prior to applying the sequence. The patient model is partitioned into regions and $B_1$ pulses are designed with the locations of SAR hot spots in each region via simulation. Different versions of the repeated $B_1$ pulse are calculated for each partition in which the SAR is minimized and the SAR distribution is different.

In another embodiment, the SAR hot spots are controlled with an initial SAR optimized $B_1$ pulse which is refined in an iterative process. The SAR is simulated using an initial patient model. After a local hot spot is located, the patient model calculation is updated with the location of the local hot spot such as in a weighted fashion. Then the SAR is simulated with the updated patient model to define a re-optimized $B_1$ pulse. The process is iterated until sufficient $B_1$ pulses have been calculated.

In another embodiment, regions with low SAR levels are located and incorporated into the calculation such that the $B_1$ pulse is configured to generate local hot spots in those locations. An initial patient model is used to simulate a SAR response. A SAR low point is located and incorporated into the patient model in a weighted fashion such that a SAR hot spot of another version of the $B_1$ pulse is generated at the location of the low SAR point. The patient model calculation is updated until sufficient RF pulses have been calculated.

In another embodiment, the patient model is partitioned into a number of regions and local hot spots are assigned to locations in the regions. The SAR is simulated for the first region and the patient model calculation is updated to generate a hot spot at the assigned location. The process is iterated until the patient model incorporates the assigned SAR hot spots.

In another embodiment, the patient model is partitioned into a number of regions. Some of the regions are weighted and incorporated into the patient model that reflects a desired SAR distribution. Versions of the repeated $B_1$ pulse are selected such that a best approximation of the desired SAR distribution is obtained. The process is iterated until sufficient RF pulses have been calculated.

In another embodiment, the patient model is partitioned into a number of regions. The regions are analyzed with respect to similarities between them, e.g. similar sensitivity to a certain transmit element or certain RF modes of the transmit element. Principal component analysis or other analysis methods are contemplated. The regions are weighted and combined into a model that reflects a desired SAR distribution. Versions of the repeated RF pulse are selected that best approximates the desired SAR distribution. The process is iterated until sufficient RF pulses have been calculated.

In another embodiment, the patient model is partitioned into a number of regions. The regions are analyzed with respect to similarities between them, e.g. similar sensitivity to a certain transmit element or certain RF modes of the transmit element. Principal component analysis or other analysis methods are contemplated. Versions of the repeated RF pulse are selected to constrain the SAR hot spots in these regions to certain values. The process is iterated until sufficient RF pulses have been calculated.

In another embodiment, the patient model is analyzed with respect to regions that are sensitive to high SAR values, e.g. regions that may exploit high electromagnetic fields. Versions of the repeated RF pulse are selected to constrain the SAR hot spots in these regions to selected levels. The process is iterated until sufficient RF pulses have been calculated.

In another embodiment, the patient model is analyzed with respect to regions that are sensitive to high SAR values, e.g. regions that may exploit high electromagnetic fields. The regions are weighted and combined into a model that reflects a desired SAR distribution. Versions of the repeated RF pulse are selected that best approximates the desired SAR distribution. The process is iterated until sufficient RF pulses have been calculated.

The invention has been described with reference to the preferred embodiments. Modifications and alterations may occur to others upon reading and understanding the preceding detailed description. It is intended that the invention be construed as including all such modifications and alterations insofar as they come within the scope of the appended claims or the equivalents thereof. In the claims, any reference signs placed between parentheses shall not be construed as limiting the claim. The word "comprising" does not exclude the presence of elements or steps other than those listed in a claim. The word "a" or "an" preceding an element does not exclude the presence of a plurality of such elements. The disclosed method can be implemented by means of hardware comprising several distinct elements, and by means of a suitably programmed computer. In the system claims enumerating several means, several of these means can be embodied by one and the same item of computer readable software or hardware. The mere fact that certain measures are recited in mutually different dependent claims does not indicate that a combination of these measures cannot be used to advantage.

The invention claimed is:

1. A method of imaging comprising acts of:
   applying a magnetic resonance sequence including a repetitively applied radiofrequency (RF) pulse by
      composing a pulse of the repetitive pulse by superposition in time of individual pulses from discrete independently controlled transmit elements, and
      varying the composition of the repetitive pulse to change specific absorption rate (SAR) hot spot locations with subsequent applications of the repetitive pulse to generate SAR hot spots in locations of SAR low spots, wherein the SAR low spots are regions of low energy deposition.

2. The method according to claim 1, comprising acts of:
   generating a series of magnetic resonance signals from a subject resulting from the magnetic resonance sequence, and
   reconstructing the magnetic resonance signals into an image.

3. The method according to claim 1, further including:
   prior to applying the magnetic resonance sequence,
      generating a plurality of versions of the repetitive pulse with SAR low spots and/or SAR hot spots in a plurality of locations, and
      varying the composition by selecting from the plurality of versions of the repetitive pulse to change the SAR hot spot locations with subsequent applications of the repetitive pulse.

4. The method according to claim 3, wherein generating versions of the repetitive RF pulse includes:

performing a pilot scan to generate a patient model of a patient;

simulating a SAR response to each version of the repetitive pulse;

determining locations of SAR hot spots of the patient based on the SAR simulation; and selecting ones from the plurality of versions of the repetitive pulse to identify which versions of the repetitive pulse to apply in the magnetic resonance sequence.

5. The method according to claim 4, wherein each of the versions of the repetitive pulse includes a discrete number of radiofrequency pattern components transmitted from a discrete number of the independently controlled transmit elements.

6. The method according to claim 5, wherein the patient model includes data regarding physical attributes of the patient and a position of the patient relative to the independently controlled transmit elements.

7. The method according to claim 4, wherein simulating the SAR response for an N-channel transmit system, where N is a discrete number, is determined by:

$$SAR=b^\dagger Qb$$

where, $$Q=\Sigma_i q_i Q_{region}(i)$$

where b is a matrix of concatenated $B_1$ pulse components $b_n$ ($1 \leq n \leq N$) of N independently controlled transmit elements, Q is a matrix corresponding to a specific subject volume, and $q_i$ are weighting factors specifying a trade-off between different hotspot regions.

8. The method according to claim 7, wherein generating the versions of the repetitive pulse further comprises acts of:

initializing the Q matrix prior to simulating the SAR response;

determining locations of the SAR low spots based on the SAR simulation;

updating the patient model calculation to incorporate the location of the SAR low spots in a weighted fashion; and generating versions of the repetitive pulse until the plurality of versions of the repetitive pulse are generated.

9. The method according to claim 4, wherein simulating the SAR response further comprises acts of:

partitioning the patient model into a plurality of regions in which the SAR can be calculated;

simulating a SAR response to each of the several versions of the repetitive pulse for each region; and generating versions of the repetitive pulse until the plurality of versions of the repetitive pulse are generated.

10. The method according to claim 4, wherein generating the versions of the repetitive pulse further comprises acts of:

updating the patient model calculation to incorporate the location of the hot spots in a weighted fashion; and generating versions of the repetitive pulse until the plurality of versions of the repetitive pulse are generated.

11. The method according to claim 4, wherein generating versions of the repetitive pulse further comprises acts of:

partitioning the patient model into a plurality of regions;

combining the partitioned models in a weighted fashion that minimizes SAR hot spot distribution and generates a desired SAR hot spot distribution;

selecting the plurality of versions of the repetitive pulse to approximate the desired SAR distribution; and generating versions of the repetitive pulse until the plurality of versions of the repetitive pulse are generated.

12. The method according to claim 3, wherein generating versions of the repetitive pulse further comprises acts of:

analyzing the patient model to determine regions of high SAR sensitivity;

generating models of the regions of high SAR sensitivity;

selecting the plurality of versions of the repetitive pulse that best approximates the desired SAR distribution; and generating versions of the repetitive pulse until the plurality of versions of the repetitive pulse are generated.

13. A magnetic resonance system including:

a plurality of RF transmitters; and a control processor programmed to perform the method of claim 1.

14. A computer readable non-transitory medium carrying a computer program which configures a processor of a magnetic resonance system to perform a method comprising act of:

applying a magnetic resonance sequence including a repetitively applied radiofrequency pulse by composing a pulse of the repetitive pulse by superposition in time of individual pulses from discrete independently controlled transmit elements, and varying the composition of the repetitive pulse to change specific absorption rate (SAR) hot spot locations with subsequent applications of the repetitive pulse to generate SAR hot spots in locations of SAR low spots, wherein the SAR low spots are regions of low energy deposition.

15. A magnetic resonance system comprising:

N RF transmit elements, where N is a plural discrete number, disposed adjacent a patient receiving region;

N RF transmitters, each connected with one of the RF transmit elements;

a control processor programmed to control the transmit elements to apply a plurality of variations of a repetitive pulse by superposition in time of individual pulses from discrete independently controlled transmit elements during a magnetic resonance sequence, the variations of the repetitive pulse being configured to cause specific absorption rate (SAR) hot spot locations with subsequent applications of the repetitive pulse to generate SAR hot spots in locations of SAR low spots, wherein the SAR low spots are regions of low energy deposition;

a magnetic resonance signal receive system configured to receive magnetic resonance signals generated by the magnetic resonance sequence;

a resonance signal processor configured to process the received magnetic resonance signals; and a display configured to display results of the magnetic resonance signal processing.

16. A method of imaging, in which applying a magnetic resonance sequence includes a repetitively applied radiofrequency (RF) pulse capable of causing a specific absorption rate (SAR) hot spot, the method comprising acts if:

determining locations of SAR hot spots and SAR low spots based on stored SAR simulation data, wherein the SAR low spots are regions of low energy deposition;

determining a composition of the repetitive pulse to change the SAR hot spot locations with subsequent applications of the repetitive pulse to generate SAR hot spots in the location of SAR low spots; and varying the composition of the repetitive pulse based on the determined composition of the repetitive pulse.

17. The method according to claim 16, wherein the act of determining locations of SAR hot spots and SAR low spots comprises acts of:

performing a pilot scan to generate a patient model;

simulating a SAR response to versions of the repetitive pulse; and storing the SAR response as the stored SAR simulation data.

18. The method according to claim 16, comprising acts of:
generating a series of magnetic resonance signals from a subject based on the applied magnetic resonance sequence; and
reconstructing the magnetic resonance signals into an image.

19. The method according to claim 16, wherein the act of varying the composition of the repetitive pulse comprises an act of varying components of individual pulses from discrete independently controlled transmit elements that are simultaneously provided by the discrete transmit elements for the repetitive pulse.

* * * * *